United States Patent [19]

Iwai et al.

[11] 4,105,902

[45] Aug. 8, 1978

[54] TOUCH SENSITIVE INPUT FOR ELECTRONIC WRISTWATCH AND/OR ELECTRONIC CALCULATOR

[75] Inventors: Yuichiro Iwai; Akio Shimoi; Yoshikazu Kawamura, all of Suwa, Japan

[73] Assignee: Kabushiki Kaisha Suwa Seikosha, Tokyo, Japan

[21] Appl. No.: 730,763

[22] Filed: Oct. 8, 1976

[30] Foreign Application Priority Data

Oct. 8, 1975 [JP] Japan ................................ 50-121591
Oct. 17, 1975 [JP] Japan ................................ 50-125021
Dec. 1, 1975 [JP] Japan ................................ 50-143505

[51] Int. Cl.² .................. H03K 3/26; G08B 21/00; G04C 3/00
[52] U.S. Cl. .................. 307/308; 307/314; 328/5; 340/365 E; 58/23 R
[58] Field of Search .......... 307/308, 314, 247 A; 328/5; 340/365 E, 258 C; 200/DIG. 1; 58/23 R

[56] References Cited

U.S. PATENT DOCUMENTS

| 3,624,518 | 11/1971 | Dildy, Jr. ................ 340/365 E |
| 3,736,445 | 5/1973 | Van Sickle ................ 328/5 |
| 3,737,673 | 6/1973 | Suzuki ................ 307/214 |
| 3,909,625 | 8/1975 | Colglazier et al. ................ 328/5 |
| 3,925,978 | 12/1975 | Naito ................ 307/314 |
| 3,944,843 | 3/1976 | Vaz Martins ................ 328/5 |

*Primary Examiner*—Stanley D. Miller, Jr.
*Assistant Examiner*—B. P. Davies
*Attorney, Agent, or Firm*—Blum, Moscovitz, Friedman & Kaplan

[57] ABSTRACT

A touch sensitive input particularly suited for use with an electronic wristwatch, an electronic calculator or a combination thereof is provided. The touch sensitive input includes a touch sensitive contact connected to the input of a detector circuit, the detector circuit input being normally referenced to a first potential for producing a detector circuit output signal representative of the first potential. Engagement of the touch sensitive contact selectively references the detector circuit input to a second potential and in response thereto produces a detector circuit output signal representative of the second potential. The detector circuit includes at least an MOS or C-MOS input stage. Additional circuitry is provided for eliminating chatter in the output signal produced by the input stage, for preventing the producing of two signals representative of the unintended engagement of more than one touch sensitive contact, and for providing an indication that a touch sensitive contact has been inadvertently engaged.

11 Claims, 18 Drawing Figures

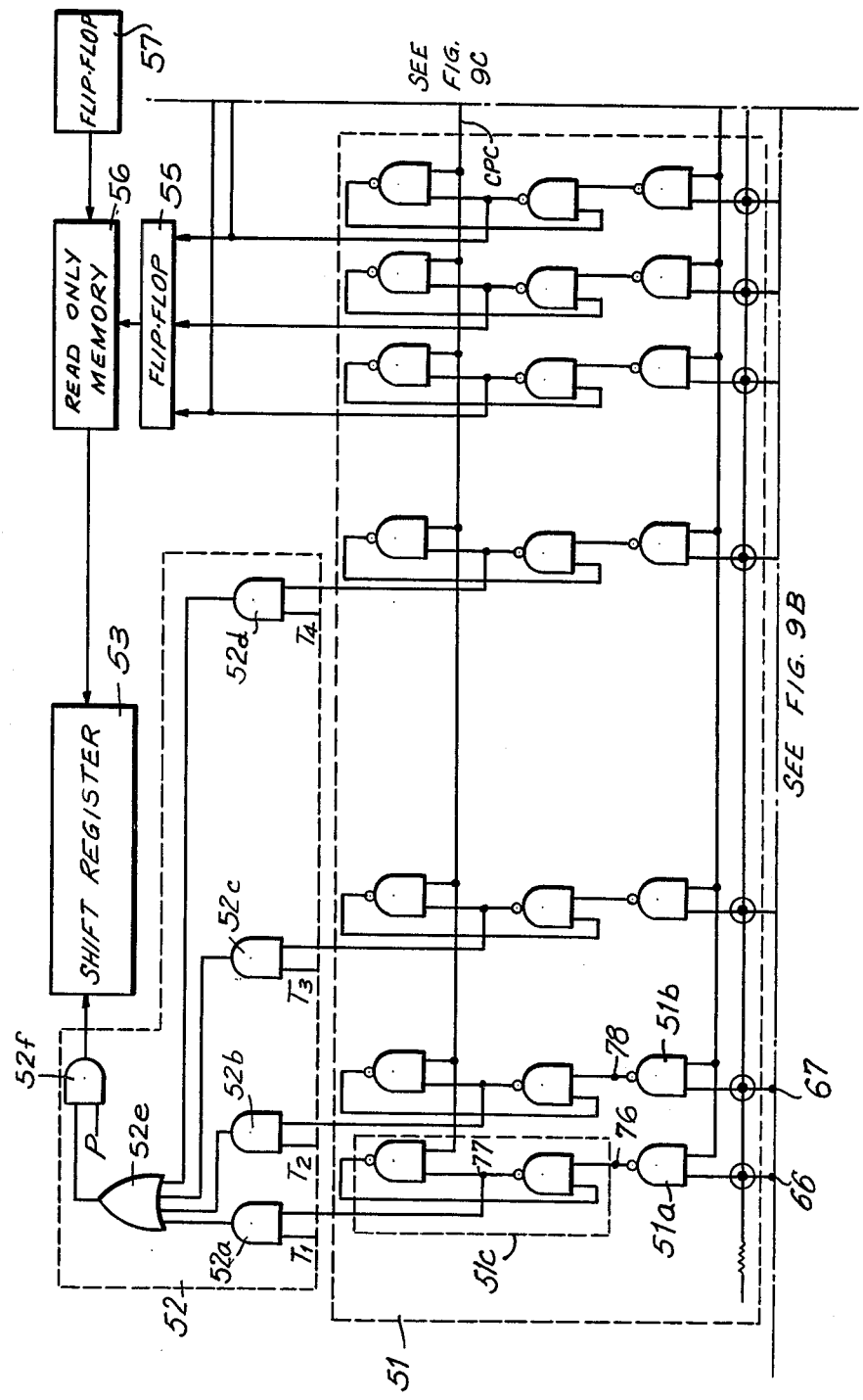

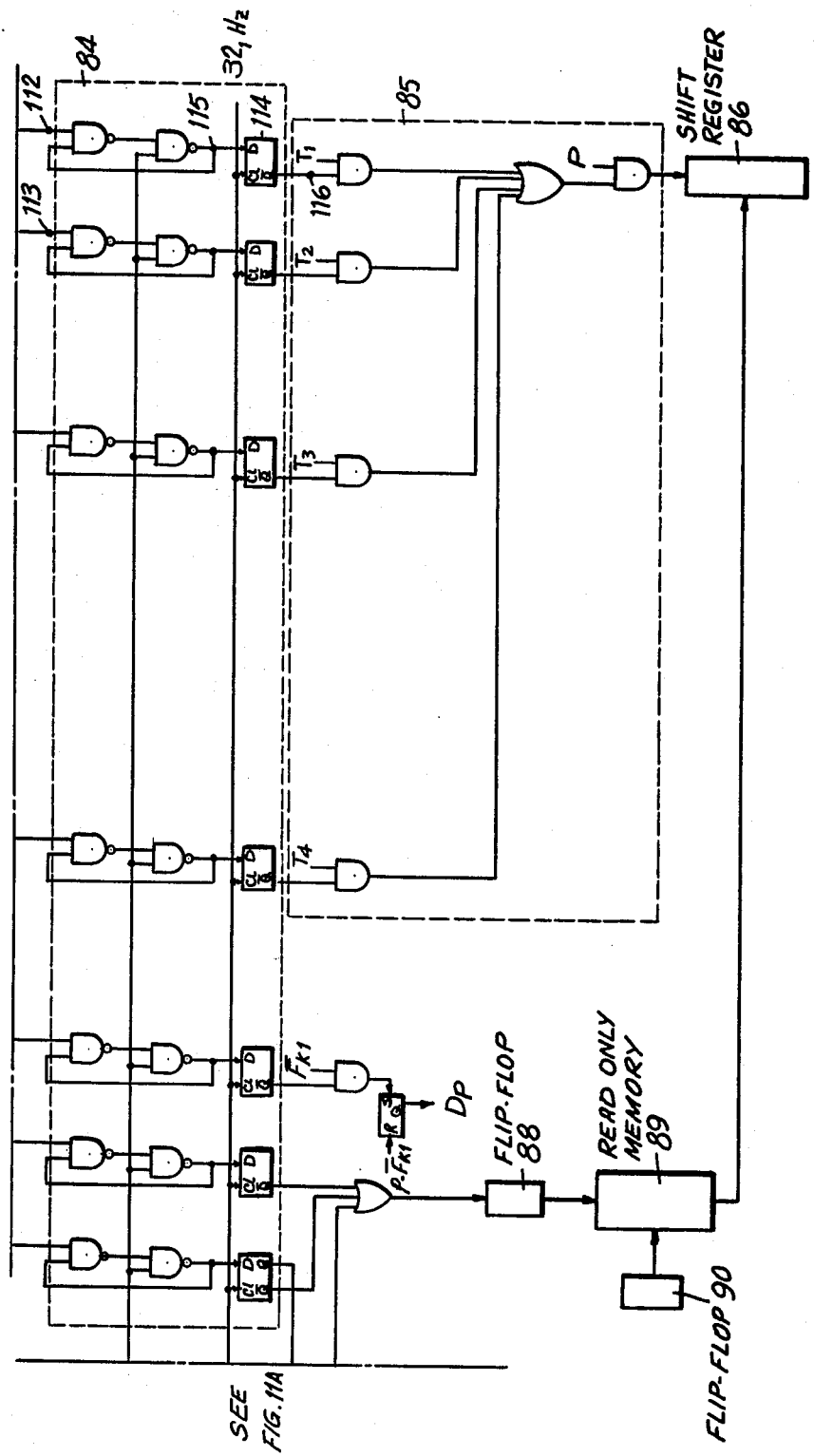

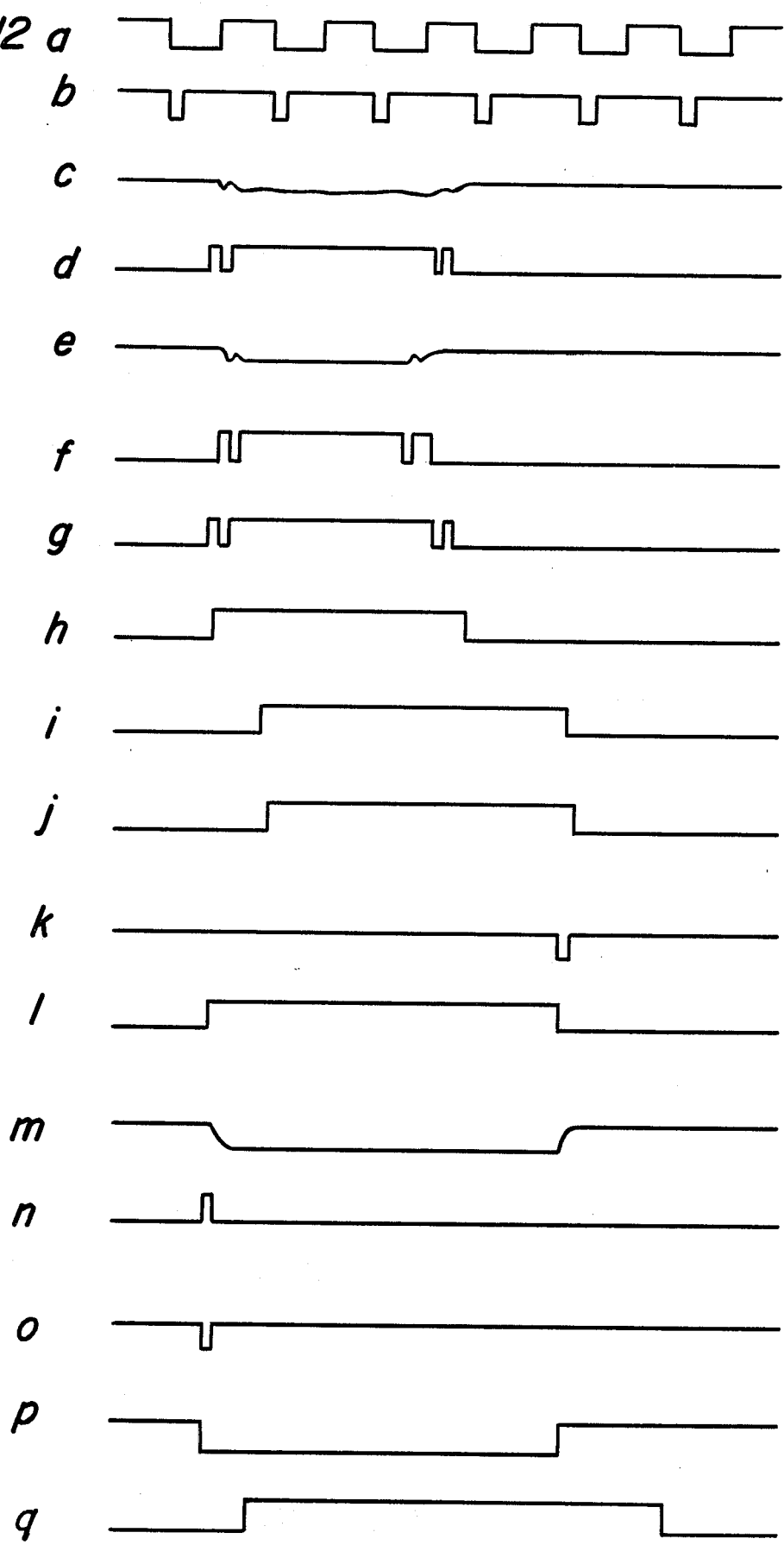

TOUCH SENSITIVE INPUT FOR ELECTRONIC WRISTWATCH AND/OR ELECTRONIC CALCULATOR

BACKGROUND OF THE INVENTION

This invention is directed to a touch sensitive input for electronic wristwatches, electronic calculators, and combinations thereof, and in particular to the use of touch sensitive inputs for use in electronic utilization devices, and in particular to touch sensitive inputs particularly suited for replacing mechanical switches in electronic digital display wristwatches, electronic calculators and miniaturized combination electronic calculators and watches.

Heretofore, the most common input device utilized in small-sized electronic instruments such as electronic calculators, electronic wristwatches and the like have been manually-actuated mechanical switches of the push-button and push-pull variety. Usually, the manually operated switches are the only moveable parts that remain when the instrument is converted over from mechanical operation to electronic operation.

For example, balance wheel mechanical wristwatches included a mechanical movement having a considerable number of miniaturized wheels, axles, springs, screws and the like. By comparison, electronic wristwatches utilize a quartz crystal vibrator as a time standard, with the remaining elements being integrated circuit chips, and an occasional resistor and/or capacitor. Thus, in LED and LCD digital display electronic wristwatches, the only mechanical parts therein are the input switches, which input switches are required in LED wristwatches for turning on the display elements and for correcting the time displayed thereby, and which input switches are needed in LCD wristwatches for correcting the time displayed thereby and if desired, selectively illuminating the LCD displays. Nevertheless, these mechanical switches have proved to be less than completely satisfactory since same render more difficult the waterproofing of the interior of the electronic wristwatch and additionally, decrease the reliability of the input operations to be effected thereby.

Similarly, in small-sized electronic table calculators and calculators included in electronic wristwatches, the inputs are effected by a keyboard, with each key being a mechanical reed switch or contact spring switch. Since such calculators require a considerable number of input keys for inputting each of the numbers, registration, function, decimal point, equal and clear, a large number of keys must be disposed in a small area, resulting in frequent displacement of keys other than the key desired. Although integrated circuitry has permitted each of the electronic components of the calculator to be miniaturized, a similar miniaturization in the scale of the input keys renders it impossible for the input keys to be manually actuated by a finger, without actuating a plurality of surrounding keys. To overcome this problem, electronic wristwatches having calculators therein have been provided with an actuating member for pushing the keys in order to actuate same thereby preventing inadvertent actuation of the input keys surrounding the input key that the operator desires to actuate. Accordingly, a touch sensitive input for small-sized electronic utilization devices such as electronic calculators and electronic wristwatches that improves reliability and prevents selecting unwanted input functions when a plurality of compact input switches are required is desired.

SUMMARY OF THE INVENTION

Generally speaking, in accordance with the instant invention, a touch sensitive input for use in electronic utilization devices such as small-sized calculators, wristwatches and the like is provided. The touch sensitive input includes a touch sensitive contact, and a detector circuit means having an input to which the touch sensitive contact is connected and an output. A first potential is normally applied to the detector circuit means input, selective engagement of the touch sensitive contact causing the application of a second potential to the detector circuit input. Said detector circuit means produces first and second output signals respectively representative of said first and second potentials. The detector circuit includes at least an MOS or C-MOS input stage which may take the form of an inverter circuit. The inverter circuit input is coupled to the touch sensitive contact for producing a binary lever signal at its output having first and second binary states respectively representative of and in response to said first and second potentials.

A discriminating circuit is provided for detecting the outputs of inverter circuits associated with adjacent touch sensitive contacts for preventing the second binary level signal produced in response to the inadvertently touched touch sensitive contact from being applied to the electronic utilization device.

A chatter eliminating circuit is coupled to the inverter-output for eliminating chatter produced by the touch sensitive contact.

An alarm circuit is provided for indicating if a touch sensitive contact is engaged beyond a predetermined period of time as by water or dust, in order to reduce current consumption thereby.

Accordingly, it is an object of the instant invention to provide an improved touch sensitive input for use in electronic utilization devices such as calculators, wristwatches and the like.

Another object of the instant invention is to provide a highly reliable non-mechanical touch sensitive input for use in an electronic wristwatch.

Still another object of the instant invention is to provide a touch sensitive input that is particularly suitable for use in a keyboard for inputting numerical and functional information to a miniaturized electronic calculator.

Still a further object of the instant invention is to provide a plurality of touch sensitive inputs forming a keyboard for a calculator, wherein actuating signals produced by touch sensitive keys that are inadvertently touched are prevented from being applied to the calculator circuitry to cause misoperation thereof.

And still a further object of the instant invention is to provide a touch sensitive input for a combination electronic wristwatch-calculator that decreases the current consumption therein.

Still other objects and advantages of the invention will in part be obvious and will in part be apparent from the specification.

The invention accordingly comprises the features of construction combination of elements, and arrangement of parts which will be exemplified in the construction hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which:

FIG. 12 is a wave diagram illustrating the operation of the touch sensitive input circuit depicted in FIGS. 11A, 11B and 11C.

DESCRIPTION OF THE PREFERRED EMBODIMENTS

Figure 1:
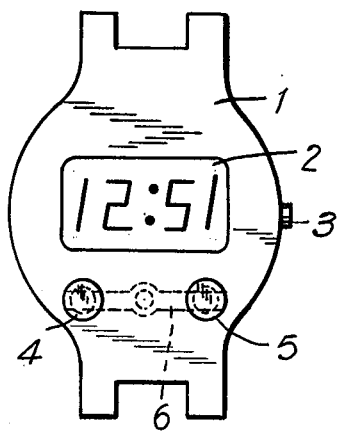
FIG. 1 is a plan view of digital display electronic wristwatch constructed in accordance with the prior art.
Figure 2:
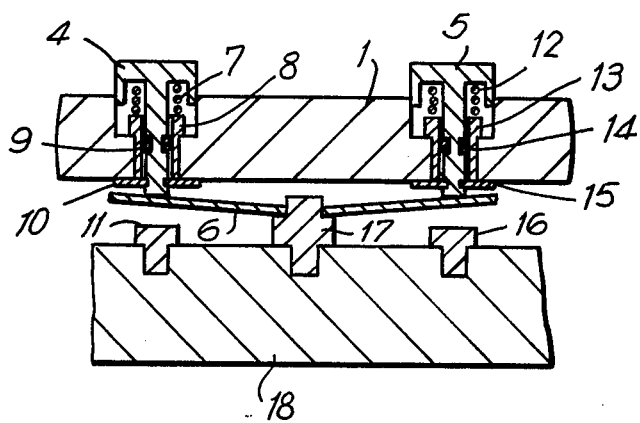
FIG. 2 is a sectional view of the digital display electronic wristwatch depicted in FIG. 1.

Reference is now made to FIGS. 1 and 2, wherein an electronic digital display electronic timepiece constructed in accordance with the prior art is depicted. The electronic timepiece includes a case 1 having either an LED or LCD digital display 2. The case 1 supports two mechanically operated push-button switches 4 and 5 and a push-pull switch 3. In the electronic wristwatch depicted in FIG. 1, the select switch 4 is utilized to select a digit of time, such as minutes, tens of minutes, hours or tens of hours to be corrected, and push-button switch 5 is utilized to correct the digit selected by the push-button 4 by indexing same by one for each displacement of push-button switch 5. The push-pull switch 3 is utilized as a safety switch for preventing inadvertent actuation of the push-button switches 4 and 5 during normal use of the electronic wristwatch.

As is illustrated in FIG. 2, push-button switch 4 includes a coil spring 7, a collar 8, an O-ring gasket 9 and an E-ring 10 for displaceably positioning the push-button 4 in the watch case. A support member 18 supports a spring holder 17, which spring holder in turn supports a resilient conductive contact spring 6 in position with the push-button 4. The resilient conductive spring 6 is resiliently biased against the push-button 4, which push-button is maintained in a normally biased upper position by coil spring 7. Support member 18 includes a metal contact 11 therein, which contact is coupled to the circuitry (not shown) in the electronic timepiece for selecting the digit of time to be corrected. In response to a pushing of push-button 4, the resilient spring contact 6 is deflected into contact with fixed contact 11 to thereby actuate the digit select circuitry in the electronic timepiece. Push-button 5 includes contact spring 12, collar 13, O-ring 14, and E-ring 15 for displacing resilient spring contact 6 into contact with fixed contact 16, which contact is coupled to the setting circuitry (not shown) in the electronic timepiece. Accordingly, push-button 5 operates in the same manner as push-button 4.

It is noted that the stroke through which the push-button 4 must be displaced in order to make contact with contact 11 results in a delay from the moment that the push-button is displaced until contact is made. Thus, when such push-button switches are utilized in electronic timepieces for setting the seconds display, seconds correction is less than exact due to the delay caused by the stroke through which the push-button is displaced. Additionally, the space required to include push-button switches in a small-sized electronic wristwatch is considerable, and thereby increases the size of the electronic timepiece proportionately with the number of push-button switches, and, in particular, increases the thickness of the electronic timepiece. Finally, the manner in which the push-button switches are mounted in the case result in the requirement of water-proofing gaskets in order to obtain a water-proofed interior in the watch case. The instant invention is characterized by the elimination of the above-noted defects by utilizing a touch sensitive contact switch including MOS field-effect transistors.

Figure 3:
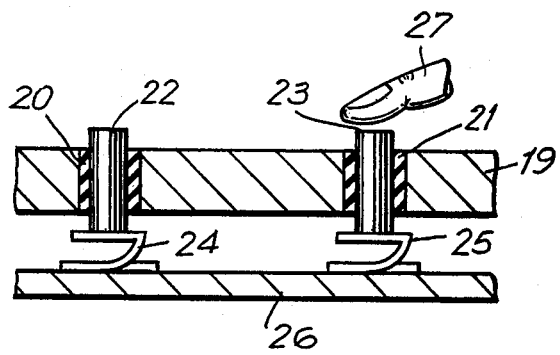
FIG. 3 is a sectional view of a touch sensitive input arrangement constructed in accordance with the instant invention.

Reference is now made to FIG. 3, wherein a touch sensitive contact switch constructed in accordance with the instant invention is depicted. Touch contacts 22 and 23 are fixedly secured in electric insulating collars 20 and 21 and are electrically connected to wiring terminals on an integrated circuit board 26 through resilient electrical contacts 24 and 25. In a preferred embodiment, touch sensitive contacts 22 and 23 are formed of metal or another conductive material. While slight displacement of touch contacts 22 and 23 may be possible due to the resilience of collars 20 and 21, such displacement plays no functional role in the actuation of the touch sensitive switch. As used herein, "touch sensitive switch" refers to a switch actuated by touch without substantial displacement as exemplified, by way of example, by the switch more particularly described in FIG. 4. As will be detailed hereinafter with respect to the description of the manner in which the touch sensitive switch operates, the absence of any movable element, and the reduction in the number of elements coupled with the improved water resistant qualities and reliability obtained renders the touch sensitive switches depicted in FIG. 3 particularly suited for use in miniaturized electronic utilization devices such as wristwatches, calculators and the like.

Figure 4:
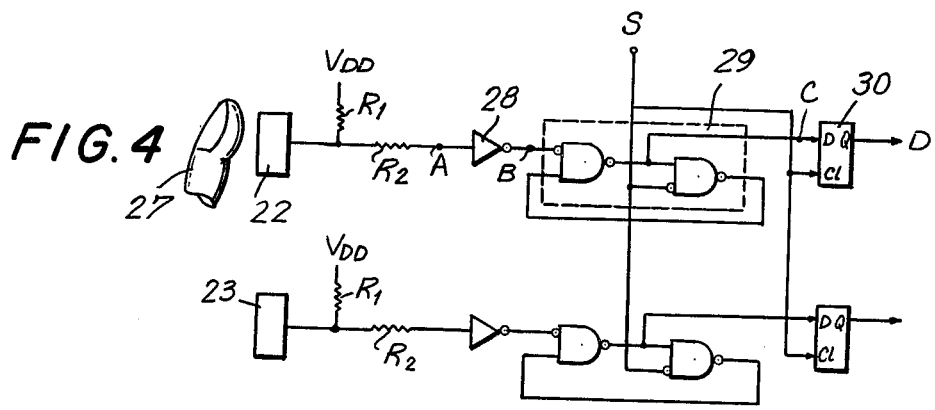
FIG. 4 is a circuit diagram of a touch sensitive input circuit constructed in accordance with a preferred embodiment of the instant invention.

Reference is now made to FIG. 4, wherein a pressure sensitive input circuit for use with the touch sensitive contacts 22 and 23 of FIG. 3 is depicted. The touch sensitive contacts 22 and 23 are actuated in response to being touched by a user's finger 27 in order to ground the touch sensitive contact 22 with respect to a source potential and thereby, in combination with a C-MOS inverter-amplifier circuit produce an actuating signal. Specifically, touch sensitive contact 22 is coupled in parallel with a supply voltage $V_{DD}$ and a resistor $R_1$. A resistor $R_2$ is coupled intermediate the junction of resistor $R_1$ and touch sensitive contact and a C-MOS inverter-amplifier circuit 28. The output of C-MOS inverter-amplifier circuit 28 is coupled to the reset input of a set-reset NAND gate flip-flop circuit 29. The set input of the set-reset NAND gate flip-flop circuit 29 is adapted to receive a signal S synchronized by a clock signal such as an intermediate output of the timekeeping circuitry of a timepiece. The output of the set-reset flip-flop circuit 29 is applied to a delay flip-flop 30, which is then clocked by signal S to produce an actuating signal in a manner to be discussed in greater detail below.

Figure 5:
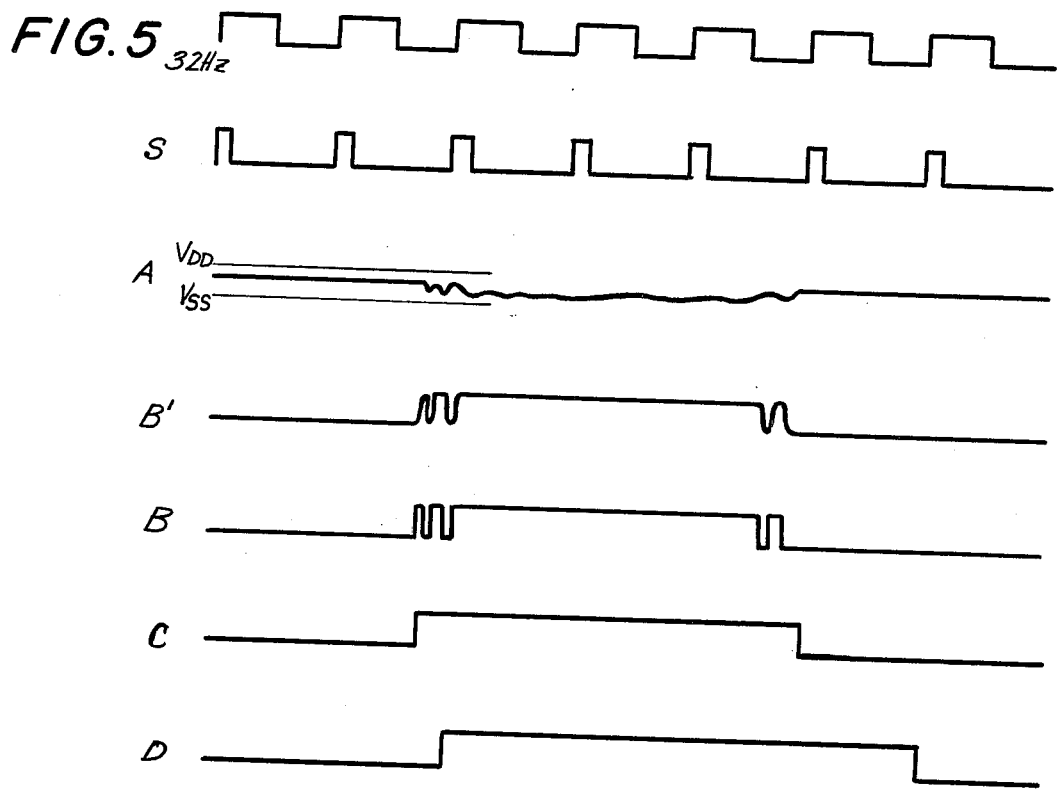
FIG. 5 is a wave diagram illustrating the operation of the touch sensitive input circuit depicted in FIG. 4.

As is illustrated in FIG. 5, when the finger 27 is maintained out of contact with touch sensitive contact 22, the input A of the C-MOS inverter 28 is biased through resistor $R_1$ to a voltage level substantially equal to the supply voltage $V_{DD}$. However, when the finger 27 contacts the touch sensitive contact 22, the voltage at the input to the C-MOS inverter 28 is dropped substantially to a reference voltage $V_{SS}$. The drop in the voltage at the input to the C-MOS inverter is caused by the touch sensitive contact being engaged by finger 27, thereby placing the resistance between ground and finger 27, to wit, the skin resistance of the human body, hereinafter referred to as $R_S$, in series parallel with the resistor $R_1$ between ground and $V_{DD}$. Accordingly, the voltage seen at the input A of the C-MOS inverter 28 when finger 27 touches the touch sensitive contact 22 equals:

$$\frac{R_S}{R_S + R_1} \cdot V_{DD}$$

Thus, when $R_S << R_1$, the voltage at the input A of the C-MOS inverter approaches 0.0 Volts. Although the actual skin resistance $R_S$ differs depending upon the individual, such skin resistances are usually on the order of 10 MΩ or less. Accordingly, if the magnitude of the resistance $R_1$ is predetermined to be on the order of 22 MΩ, by way of example, a sufficient drop in the voltage seen at the input A of the inverter 28 will be effected for producing an actuating signal.

Figure 7:
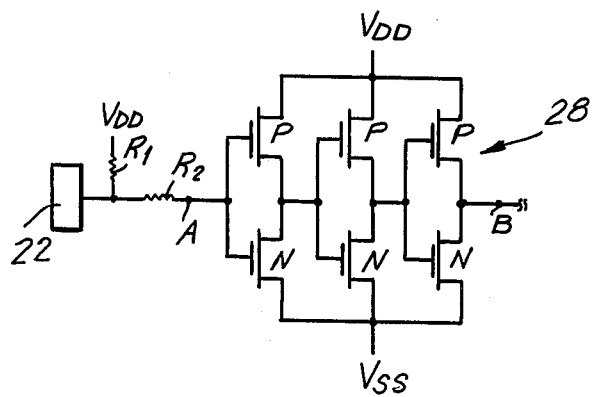
FIG. 7 is a detailed circuit diagram of the inverter circuit depicted in FIG. 4.

As illustrated in FIG. 5, the drop in the voltage at the input terminal A due to engagement of finger 27 against touch sensitive contact 22 is detected by the C-MOS inverter 28, which inverter produces the output signal B. If the C-MOS inverter is formed of three stages, such as is illustrated in FIG. 7, the signal B illustrated in FIG. 5 is produced. However, if a single stage C-MOS inverter 28 is provided, the wave form B' of FIG. 5 will be produced at the output inverter 28. Accordingly, it is preferred to utilize at least three series connected C-MOS inverter stages in order to produce the output signal B illustrated in FIG. 5.

It is noted that the output signal B includes chatter signals resulting from the noise produced at the touch sensitive contact 22. In order to eliminate the chatter signals, a set-reset flip-flop circuit 29 and delay flip-flop 30 are provided. Specifically, the chatter eliminating circuit is driven by a pulse signal S, which signal is synchronized, by way of example, to a 32 Hz clock signal, which signal has a sufficient period for eliminating any chatter or noise signals that could be introduced into the circuit by the touch sensitive contact. The 32 Hz signal could be one of the intermediate signals of the timekeeping circuit of an electronic timepiece.

Specifically, the touching of the touch sensitive contact 22 lowers the voltage level at the input A of the C-MOS inverter 28 and in response to the odd number of C-MOS inverter stages produces a HIGH binary level signal at the output B of the C-MOS inverter circuits 28, which output is applied at the reset input of the set-reset circuit 29. The reset input includes a NOT gate to thereby invert the output signal B as it is applied to the first NAND gate of the set-reset circuit. Accordingly, in response to the LOW level input applied by the NOT gate to the first NAND gate, a HIGH level signal is produced at the output of the first NAND gate, which output is applied to the D terminal of delay flip-flop 30. Thereafter, upon the first leading edge of the synchronizing signal S, the actuating signal D, absent the chatter signals introduced by the touch sensitive input, is produced. It is noted that once the finger is removed from the touch sensitive plate 22, the voltage level at the input A of the C-MOS inverter circuit 28 increases, thereby applying a LOW level signal at the reset input NOT gate of the first NAND gate to thereby return the output thereof (signal C) to a LOW state in response to the next leading edge of synchronizing pulse signal S being applied to the set input of set-reset circuit 29. Signal D, the output of flip-flop 30, returns to a LOW level in response to the leading edge of the next pulse of signal S after the pulse that set set-reset circuit 29.

Accordingly, an actuating signal can be produced by the touching of a touch sensitive contact with the chatter noise eliminated therefrom. It is noted that a resistance $R_2$ is disposed intermediate the junction between touch sensitive contact 22 and resistor $R_1$, and the input to the C-MOS inverter circuit 28 in order to prevent the gate input of the C-MOS inverter from being damaged by a sudden surge in the voltage applied thereto in response to static electricity, or any other condition that might cause such a surge in voltage. In the preferred embodiment, a resistance on the order of 1MΩ is capable of reducing surges in voltage applied to the gate input of the C-MOS inverter circuit. It is noted however that a C-MOS gate circuit has an extremely high input impedance and during fabrication can be formed with an inherent diode and resistance characteristic for protecting against momentary abnormal surges in voltage applied thereto.

It is noted that the touch sensitive switch depicted in FIG. 4 utilizes the inherent skin resistance of a human's body. Nevertheless, a hum induction detection type touch sensitive switch that detects a hum induced in the human body can also be utilized with the input circuit disclosed in FIG. 4. However, in such case, the finger may only be utilizes when same is floated from a ground potential. In any event, by utilizing the aforementioned touch sensitive input switches as correction switches in an electronic wristwatch, the number of parts, i.e., stationary and moving, is clearly decreased, and the space occupied by the switching portion is clearly reduced and the contacts are eliminated. Accordingly, a highly reliable compact input switch is presented in which contact displacement and difficulties in waterproofing the interior of the electronic timepiece are eliminated.

It is noted that the touch sensitive input circuit depicted in FIG. 4 consumes substantially no current when a finger is not touching the touch sensitive plate 22 and causes only a small current flow when the finger 27 touches the touch plate 22. When a touch sensitive switch is used as a correction switch in an electronic wristwatch, the infrequent use of the correction switches renders the current consumption caused thereby to be negligible when compared with the amount of current utilized to power the electronic timepiece over an extended period of time. However, when the electronic timepiece includes calculator circuitry and a plurality of touch sensitive input keys for providing functional and numerical information to the calculator circuitry, the frequent use of the keys required to operate the calculator circuitry causes an increase in current consumption and renders desirable the reduction of the amount of current used for each actuating signal produced by the touch sensitive input circuitry.

As is illustrated in FIG. 7, the C-MOS inverter 28 includes three series connected C-MOS inverter stages, for shaping the contact signal produced by a touching of the touch sensitive plate in order to provide a shaped contact signal to the chatter preventing circuit. As illustrated in FIG. 5, when the signal at the input A of the C-MOS inverter 28 is at a HIGH level, the N-channel MOS transistors in the inverter circuit 28 are switched ON and the signal produced at the output B is at a LOW voltage level and accordingly, the current consumed by the C-MOS inverter 28 is minimal since a substantially zero current flow occurs. It is noted however that when the input A to the inverter 28 is at a LOW voltage level, the P-channel MOS transistors in the inverters are switched ON to thereby place the output B of the inverter 28 at a HIGH voltage level. Due to the relatively poor shaping of the signal applied at the input A of the inverter, the current required to energize the inverter for shaping the wave forms applied reaches at least several $\mu A$.

In order to reduce the current consumption, the resistance between the source-drain terminals of the MOS transistors should be relatively high when the transistors are switched ON. One approach for increasing the resistance between the source and drain of the C-MOS inverter when same is utilized in a touch sensitive input detector circuit, is to do so when the integrated circuit chip is being formed. By making the sourcedrain resistance more than about 1 M $\omega$ when the mask of the integrated circuit is formed, current consumption when the MOS transistors are turned ON can be decreased to 0.5 $\mu A$ and less. Additionally, the insertion of a high resistance intermediate the source of the P-channel MOS transistors and the power supply, and between the source of the N-channel MOS transistors and the reference terminal of the power supply to which same is coupled will also result in a similar reduction in the current consumed by the inverter 28.

Figure 8:
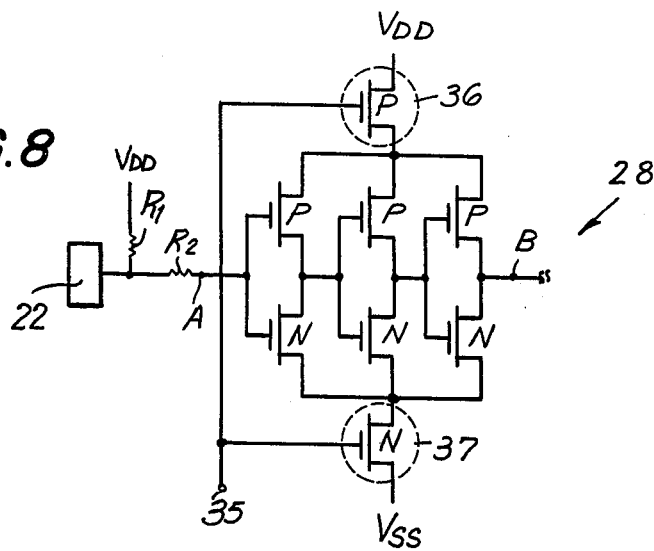
FIG. 8 is a detailed circuit diagram of a touch sensitive input circuit constructed in accordance with an alternate embodiment of the instant invention.

Additionally, a reduction in current can be effected by utilizing an inverter circuit of the type depicted in FIG. 8, like reference numerals being utilized to denote like elements depicted above. In FIG. 8, a P-channel MOS transistor 36 is connected intermediate the source of the P-channel transistors of inverter circuit 28 and $V_{DD}$, and an N-channel MOS transistor 37 is connected intermediate the source of the N-channel transistors of inverter circuit 28 and $V_{SS}$. Additionally, the respective gate electrodes of transistor 36 and transistor 37 are coupled to receive a clock signal 35 having a fixed pulse width in order to control the time during which the C-MOS inverter is in an ON state. Thus, when a finger is touching the touch sensitive plate 22, an output signal is produced at B only during the period of each clock signal 35 and current only flows during that period. For example, when utilizing an electronic table calculator, by selecting the pulse width of the control signal to be equal to two words, the contact signal produced by the touch sensitive detector circuit is sustained at a HIGH voltage level during the shortest interval of time required for the particular utilization of the circuit, eventuating in substantial reduction in current consumption. The control signal may be synchronized with the signal A applied to the inverter 28.

It is noted that the MOS transistors 36 and 37 coupled to the respective source electrodes of the MOS transistors comprising the C-MOS inverter will not conduct until the inverter transistors are switched ON. Accordingly, the P-channel MOS transistor 36 and the N-channel MOS transistor 37 must be fabricated so that they operate at a threshold voltage lower than the P-channel MOS transistors and N-channel MOS transistors of the C-MOS inverter. Accordingly, a miniaturized calculator can be incorporated in an electronic wristwatch and admit of low current consumption by utilizing the inverter circuit depicted in FIG. 8 and additional liquid crystal digital display elements may also be utilized to further decrease current consumption. By such an arrangement, even a single battery can be utilized for a substantial period of time by reducing the current consumption in the manner discussed above.

Figure 6:
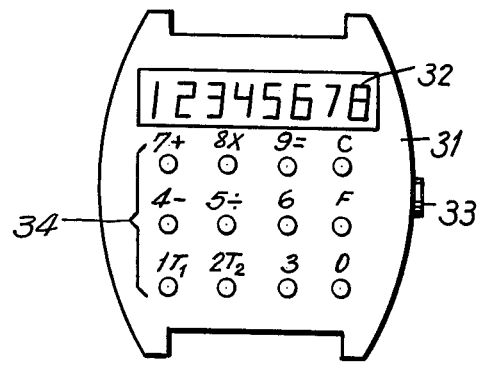
FIG. 6 is a plan view of a combination electronic wristwatch and electronic calculator constructed in accordance with a preferred embodiment of the instant invention.

As noted above, the touch sensitive input of the instant invention is particularly suitable for forming a keyboard input in a combination electronic calculator and wristwatch. Reference is now made to FIG. 6, wherein an electronic wristwatch having a calculator circuit incorporated therein and including a touch sensitive input is depicted. The wristwatch case 31 supports a digital display 32 and a touch sensitive multiple switch keyboard 34. The digital display includes eight digits formed of conventional seven-segmented liquid crystal display elements for use in the function display. The touch sensitive multiple switch keyboard 34 includes twelve keys, some of which are utilized simultaneously as function keys. Specifically, calculating functions are effected by applying information to the register after the actuation of the F key, data input being effected in the absence of F key engagement. Additionally, timepiece function switching, calculating function and time correction function to be effected by the twelve keys are selected in response to the change-over switch 33 being disposed to one of three positions. For example, time and date are corrected by using the keys S, $T_1$ and $T_2$ on the keyboard 34.

Figure 9B:
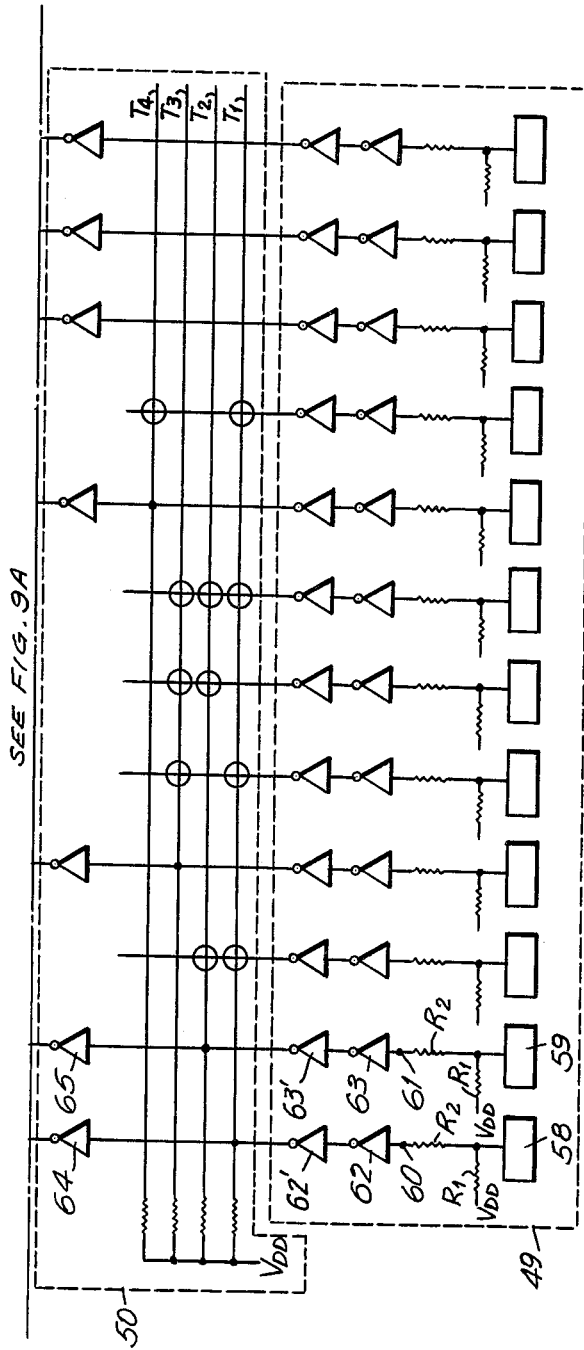
FIG. 9 is a composite block diagram showing the interconnection of the portions of the circuit diagram of a touch sensitive input circuit according to the invention more particularly illustrated in FIGS. 9A, 9B and 9C.
Figure 9C:
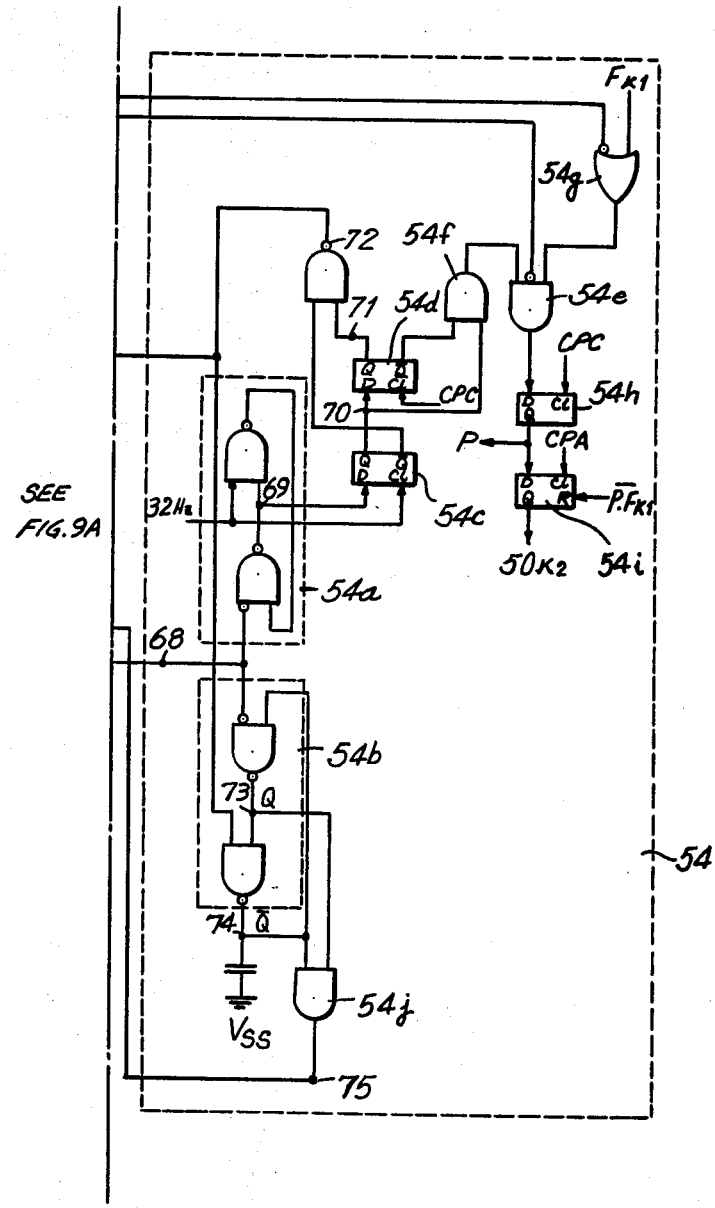
Figure 10A:
FIG. 10 is a wave diagram illustrating the operation of the circuit depicted in FIGS. 9A, 9B and 9C.
Figure 10A:
Figure 10A:
Figure 10A:
Figure 10A:
Figure 10A:
Figure 10A:
Figure 10A:
Figure 10A:
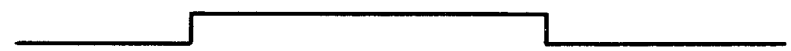
Figure 10A:
Figure 10A:
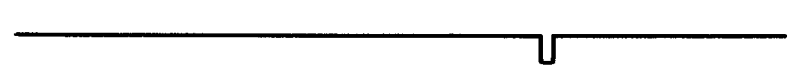
Figure 10A:
Figure 10A:
Figure 10A:
Figure 10A:
Figure 10A:

As detailed above, the touch sensitive input keys are switched on by the touching of same with a finger to reference the plate potential to ground. However, because of the small space in which the respective input keys are located, considerable dexterity is required not to touch more than one key at a time, thereby causing erroneous information to be applied to the calculator and/or electronic timepiece circuitry. Thus, in order to properly utilize the touch sensitive input keys depicted in FIG. 6, the application of multiple inputs to the calculator circuitry and/or electronic timepiece circuitry must be prevented. As is illustrated in FIGS. 9A, 9B and 9C, the instant invention is particularly characterized by circuitry for preventing multiple actuating signals from being produced by taking advantage of the fact that the area of contact between the finger and the key is maximized at the key that is to be selected and is minimized at the surrounding keys. Like reference numerals are utilized in FIGS. 9A, 9B and 9C to denote like elements depicted in FIG. 4. The touch sensitive prevention circuitry is adapted to be utilized in combination with the touch sensitive detector circuitry depicted and described above with respect to FIGS. 4, 5, 7 and 8.

A touch sensitive input circuit 49 including a plurality of touch sensitive contacts is coupled to an encoder circuit 50. The output of the encoder circuit 50 is coupled to an input control circuit 54 and to a multiple input prevention circuit 51. Multiple input prevention circuit 51 permits only the contact signal first detected by the detecting circuit 49 to be applied to the calculator circuitry. Thus, the multiple input prevention circuit 51 applies the earliest applied contact signal to a binary signal generating circuit 52, which circuit generates a four bit binary signal representative of a binary number and applies same to a shift register 53. The input control circuit 54 generates a one word cycle signal P once every period that information is to be read into the shift register 53, the signal P consisting of digits $D_1$ to $D_9$ and having a frequency of, by way of example, 448 Hz. Also coupled to the shift register 53 is a read only memory 56 and a flip-flop 57 for controlling the operation of the read only memory 56.

By way of example, reference is made to touch sensitive contacts 58 and 59 in the touch sensitive detector circuit, which touch sensitive contacts repesent the keys for reading into the shift register the binary equivalents of the numbers one (0001) and two (0010). Specifically, touch plate 58 represents the key for reading in the number one and touch plate 59 represents the key for reading in the number two in binary form to the shift register 53. In order to simplify the discussion herein, the remaining elements have not been numbered, and the specific example will be sufficient to characterize the instant invention.

As in the embodiment depicted and described in FIGS. 4–5, the contact signal is produced in response to the touch sensitive contact 58 or 59 being referenced to a LOW potential by having been touched. If it is intended to read in the number one in binary form to the shift register, the finger touches the touch sensitive contact 58. If only the touch sensitive contact 58 is touched, an actuating signal will be produced in the usual manner and thereby effect reading of a binary signal representative of the number one into the shift register 53. However, if in intending to input the number one into shift register the touch plate 59 is also lightly touched when the finger firmly touches the touch sensitive plate 58, the contact area between the touch plate and the fingertip is greater at the touch plate 58 than it is at the touch plate 59. Accordingly, the finger resistance $R_s$ in the touch plate 59 is higher than the finger resistance at the touch plate 58, thereby taking the potential seen at the input 61 of the inverter circuit 63 a longer time to drop than the potential seen at the input to the C-MOS inverter 62. Thus, as is illustrated in FIG. 10, the contact signal $c$ produced by the touch sensitive contact 58 drops in its potential level earlier than the contact signal $e$ produced by the touch sensitive contact 59.

Thereafter, the respective contact signals $c$ and $e$ are respectively applied to the inputs of the C-MOS inverters 62 and 63 and are shaped thereby and additionally by C-MOS inverters 62′ and 64 and 63′ and 65, respectively, to produce the shaped contact signals illustrated as signals $d$ and $f$ at the outputs 66 and 67 of C-MOS inverters 64 and 65, respectively. The shaped signals $d$ and $f$ include the chatter signal components produced by the noise signal induced by the touch sensitive contacts. An OR connection joins the outputs of encoder circuit 50, whereby the signal $g$ depicted in FIG. 10 is respectively applied as a set signal to the R-S flip-flop circuit 54$a$ and R-S flip-flop circuit 54$b$. The signal $g$ commences at the earliest of the outputs of encoder circuit 50 and continues to the end of the last of the outputs. The respective set inputs of R-S flip-flop circuits 54$a$ and 54$b$ are provided with NOT (inverter) gates at the input receiving signal $g$. Thus, as the signal $g$ is applied to the set input of the R-S flip-flop 54$a$, same is inverted. At the same time, a signal, illustrated as signal $b$ in FIG. 10, having, by way of example, a 32 Hz frequency and synchronized by the clock signal $a$, is applied as the reset signal to the R-S flip-flop circuit 54$a$. R-S flip-flop circuit 54$a$ operates in the same manner as the chatter eliminating circuit depicted and described in FIGS. 4 and 5 above. By selecting the period of the reset signal to be greater than the period of chatter and external noise signals, all such chatter and noise signals are removed, as shown by signal $h$ produced at output 69 of the flip-flop.

Accordingly, the output 69 of the R-S flip-flop 54$a$ is applied to the D terminal of D-type flip-flop 54$c$. The signal $h$ is applied to D flip-flop 54$c$, which produces a Q output 70 in response to the leading edge of the 32 Hz signal $b$ applied to the clear terminal thereof, output 70 being illustrated as signal $i$ in FIG. 10. It is noted that the signal $i$ in FIG. 10 is a contact signal with the chatter eliminated therefrom.

The Q output 70 of the D flip-flop 54$c$ is in turn applied to the D input of D flip-flop 54$d$ to produce a Q output 71 (signal $j$ of FIG. 10), which is delayed by one word (by way of example, 448 Hz) when compared with the signal $i$ applied thereto. The Q output 71 of D flip-flop 54$d$ is compared with the Q output of D flip-flop 54$c$ in a NAND gate, which NAND gate produces an output signal 72 (signal $k$ of FIG. 10) representative of the one-word delay. Signal $k$ is a CPC signal characterized by a pulse generated once each word and is utilized to apply a reset signal to the reset input of the R-S flip-flop 51$c$ of the multiple output prevention circuit 51. Additionally, a one-word signal P is generated in response to the signal produced at the Q terminal of the D flip-flop 54$d$. Specifically, the Q output of D flip-flop 54$d$ and the Q output of D flip-flop 54$c$ are applied to AND gate 54$f$. The output of said AND gate is applied as one of the inputs to AND gate 54$e$. The other inputs to AND gate 54$e$ are the output of OR gate 54$g$ and the output of the R-S flip-flop of multiple input prevention circuit 51 associated with the decimal key, the latter being applied through an inverter. The inputs to OR gate 54$f$ are the output of the R-S flip-flops of circuit 51 associated with the F (function) key and an $F_{k1}$ signal. In this manner when the F (function) key and the decimal point key are touched, the generating of the signal P is inhibited by AND gate 54$e$. The signal $F_{k1}$ is a signal changed into a HIGH binary state or a LOW binary state by inputting the F input key.

The output of gate 54$e$ is applied as the D input to flip-flop 54$h$, said flip-flop being cleared by a CPC signal. Signal P is produced at the Q output of flip-flop 54$h$ and is applied as the D input to flip-flop 54$i$ which is cleared by a CPA signal defined as follows:

CPA = CPC · P

Flip-flop 54i is reset by a signal $\overline{P \cdot F_{kl}}$ and produces a Q output $50_{k2}$.

The signal applied at output 68 of the OR connection is inverted and applied to R-S flip-flop 54b as a set signal, the reset signal of said flip-flop being the output 72 of the NAND gate illustrated as the signal k in FIG. 10. A capacitor is provided between the output $\overline{Q}$ of R-S flip-flop 54b and ground so that the $\overline{Q}$ output 74 is delayed relative to the Q output of the flip-flop, as illustrated respectively by signals m and l in FIG. 10 so that the application of the Q and $\overline{Q}$ signals to the AND gate 54j produces a signal 75 at the output thereof illustrated as n in FIG. 10. The output signal 75 consists of a short pulse occurring once for each actuation of one or more touch sensitive contacts and is coincident with the beginning of the earliest signals d and f and representative of the actuation of the first actuated contact. Output signal 75 is applied to the first input of each of the NAND gates 51a and 51b, the second input of NAND gates 51a and 51b being from the associated one of inverters 64 and 65. The output 76 of NAND gate 51a is shown by signal o of FIG. 10 while the output 78 of the NAND gate 51b is held at a HIGH voltage level so as not to set the R-S flip-flop coupled thereto.

Specifically, only the contact signal produced by the touch plate 58 is detected coincident with signal m to set R-S flip-flop 51c, whereas the contact signal produced by the touch plate 19 is prevented from being applied to the R-S flip-flop associated therewith. Thus, the multiple input prevention circuit permits detection of the first applied contact signal and utilizes same to inhibit the remaining inputs such as the signal e in FIG. 10. Thereafter, the Q signal 77 of the R-S flip-flop 51c, which signal is illustrated as signal p in FIG. 10, is applied to the associated AND gate 52a to apply the binary timing signal $T_1$, representative of a count of 0001, through OR gate 52e to AND gate 52f. In this manner, each word is transmitted to shift register 53 by word signal P. Only the respective timing signals $T_1$, $T_2$, $T_3$ and/or $T_4$ associated with the contact first touched are passed to the shift register. Thus, each of the contact signals produced by the respective touch sensitive contacts perform in the manner described above so that, for example, if the contacts 3, 5, 9 as illustrated in FIG. 6 are touched by mistake, when it is intended to touch only the key 6 for inputting the number 6 to the circuitry, only the 0110 signal is transmitted to the shift register 53. Function control and decimal inputs are controlled in like manner but are applied directly to read only memory 56 through flip-flop 55.

Thus, the aforedescribed embodiment is particularly characterized by utilizing the delay which results from the reduced area contact engaged by the user's finger in the case of contacts that are inadvertently touched. By utilizing this delay, the earliest contact signal applied to the circuitry is utilized to inhibit the remaining signals applied thereto.

Figures 11, 11A:
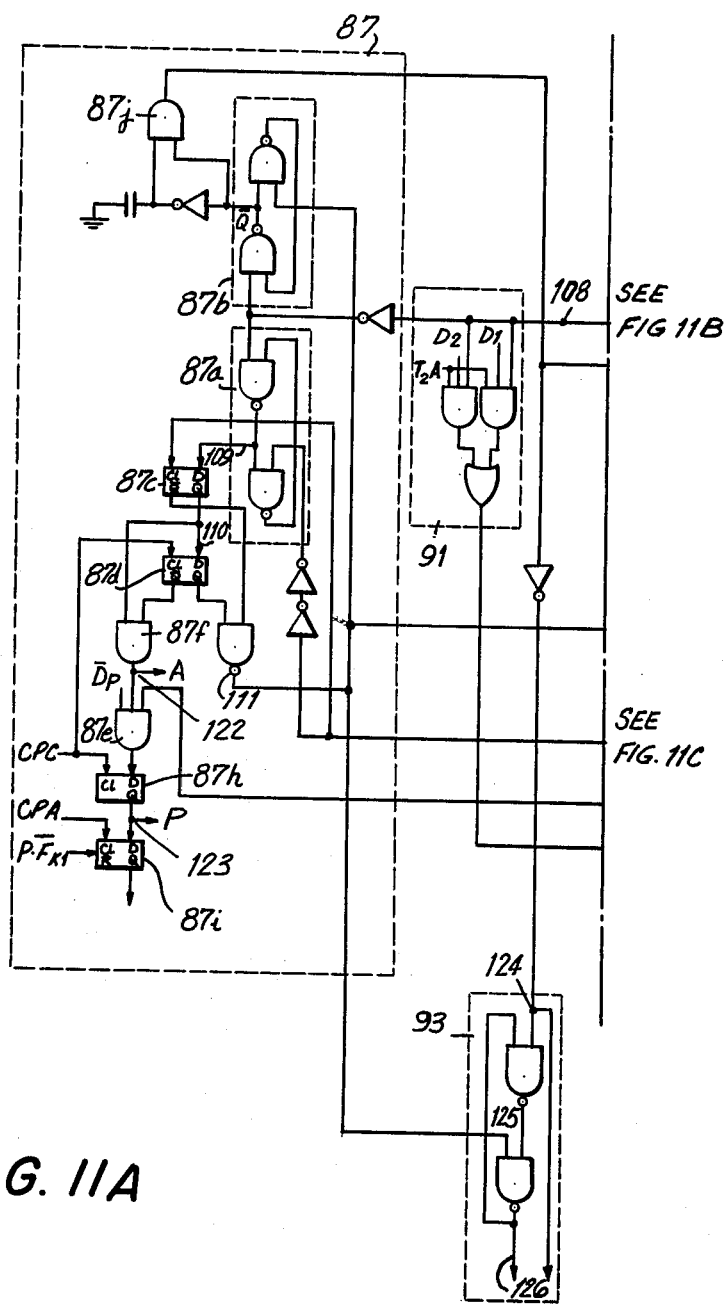
FIG. 11 is a composite block diagram showing the interconnection of the portions of the circuit diagram of a further embodiment of a touch sensitive input circuit according to the inverter more particularly illustrated in FIGS. 11A, 11B and 11C.
Figure 11B:
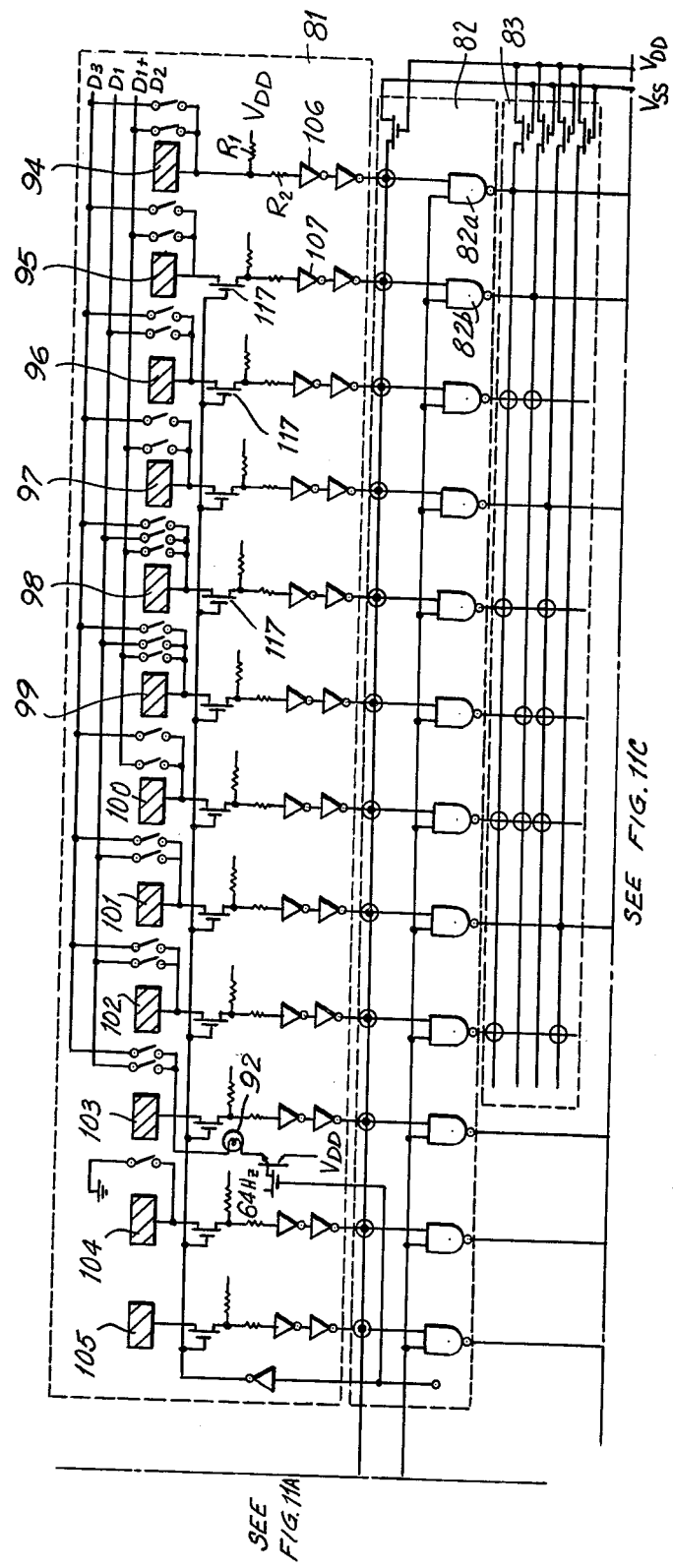

Also, it is noted that the touch sensitive contact plates can be replaced by piezoelectric elements so that the input is performed by applying a shock to the contact and the multiple input signal can be eliminated in the same manner described above. Moreover, although the touch sensitive input detailed above has been described for use in electronic timepieces having a calculator circuit, the uses therefor are not so limited.

it is noted that when the miniaturized electronic wristwatch is provided with calculator circuitry, even when the wristwatch is in a timekeeping mode so that the display is displaying timekeeping information, the current consumption is only increased when the wristwatch is converted into a calculating mode and the respective key inputs are operated. However, due to the touch sensitive nature of the input, when the input keys are in a calculating mode for inputting calculating information, contact signals can be produced by water, dust or static electricity contacting the respective touch sensitive contact plates. Reference is therefore made to FIGS. 11A, 11B and 11C wherein an alarm circuit for indicating when unwanted or unexpected contact signals have been produced is provided. The circuits depicted in FIGS. 11A, 11B and 11C operate in a similar manner to the circuitry depicted in FIGS. 9A, 9B and 9C by utilizing the detecting circuit 81 including touch sensitive contacts 94 through 105, which touch sensitive contacts are coupled to C-MOS inverter stages as described above. A multiple input prevention circuit 82 is adapted for preventing a second or later applied contact signal from being applied to the calculator circuitry. An encoder circuit 83 is coupled to the outputs of the multiple input prevention circuit and changes the "keyboard" input signal into a BCD code to be applied to a shift register 86. A chatter prevention circuit 84 is adapted to eliminate the chatter signals produced by the touch sensitive contact plates which circuit is, in turn, coupled to a BCD conversion circuit 85, which circuit is adapted to receive bit signal $T_1$ through $T_4$ and in response to the bit signal and one-word signal P produced by the chatter eliminating circuit 84, produce a four bit single digit signal to be applied to the shift register 86. An input control circuit 87 generates a set signal and a reset signal, which signals are respectively applied to the input prevention circuit 82 and the chatter eliminating circuit 84. Additionally, the input control circuit 87 produces one-word signal P for each digit from $D_1$ to $D_9$ and in a preferred embodiment being of a period representative of 448 Hz. A flip-flop 88 is provided for applying a signal to read-only memory 89 and a decision flip-flop 90 is provided for controlling said memory. The circuit configuration depicted in FIG. 11B is so constructed that the touch sensitive contacts can be utilized for both data input and function designation purposes as well as for further functions such as time display selection and time correction; function selection is by means of a function selection switch controlling function circuit 91. Additionally, a lamp 92 for illuminating the display is coupled to one touch sensitive contact to be operated thereby. A detecting circuit 93 is provided for detecting abnormal inputs.

The touch sensitive contacts 94 through 105 produce contact signals in the same manner described above with respect to the touch sensitive contacts depicted in FIGS. 4 and 9A, 9B and 9C. Accordingly, if the touch sensitive contact is to be touched to produce a binary signal representative of the number one (0001) and inadvertently the touch sensitive contact plate 94 is also touched, the contact signal respectively produced by the touch sensitive contacts 94 and 95 are illustrated as c and e in FIG. 12. Since the fingertip contacts a greater surface area of contact 94, the voltage level of the contact signal, as illustrated in FIG. 12, drops more rapidly and hence the drop in the contact signal produced by the inadvertently touched sensitive contact is delayed with respect to the intentionally touched contact. Therefore, the contact signals c and e depicted in FIG. 12 are respectively applied through C-MOS inverters 106 and 107 wherein same are respectively shaped into the signals d and f depicted in FIG. 12. Thereafter, the shaped signals d and f are applied to an OR circuit connection, output 108 of which (signal g) is applied to function circuit 91 and control circuit 87.

The input control circuit 87 is essentially identical in structure and function to circuit 54 of FIG. 9C, flip-flops 87a, 87b, 87c, 87d, 87h and 87i of FIG. 11A, corresponding to flip-flops 54a, 54b, 54c, 54d, 54h and 54i of FIG. 9C; gates 87e, 87f and 87j of FIG. 11A correspond to gates 54e, 54f and 54j of FIG. 9C; outputs 109, 110 and 111 of FIG. 11A correspond to outputs 70, 71 and 72 of FIG. 11A and like lettered waveforms in FIGS. 10 and 11 correspond. The differences between the two circuits consist of applying the $\overline{Q}$ output of flip-flop 87b through an inverter to the capacitor and one input of AND gate 87j, the other input to said AND gate being directly from said $\overline{Q}$ output. Further, the inputs to AND gate 86e are a decimal point signal $\overline{D}_p$ and a function contact signal from a flip-flop associated therewith in chatter prevention circuit 84.

Similarly AND gates 82a and 82b of FIG. 11B correspond in function to AND gates 51a and 51b of FIG. 9A. The output 115 of the chatter prevention flip-flop of FIG. 11C is applied to a D-type flip-flop 114, the output 116 of which is shown as waveform q of FIG. 12. Waveforms o and p of FIG. 12 correspond to outputs 112 and 115 of FIG. 11B. Gates 85a, 85b, 85c, 85d, 85e and 85f of FIG. 11B correspond in function to gates 52a, 52b, 52c, 52d, 52e and 52f of FIG. 9A.

It is noted that when the combination calculator and wristwatch is being utilized as a timepiece, when the key input is operated, although the information is not necessarily displayed, current is consumed. Accordingly, a plurality of N-MOS transistors 117 have been disposed intermediate the respective touch sensitive contacts and the C-MOS inverter circuits. A HIGH voltage level signal is applied to the gate electrode of the transistors 117 to turn the transistors 117 off when the combination wristwatch and calculator is operating in a time-keeping mode and a LOW voltage level signal is applied to the gate electrodes of the N-channel MOS transistors 117 when the calculator function is selected. By turning the N-channel MOS transistors 117 OFF, the detector circuitry will not be operated even when the input contacts are actuated, thereby preventing excess current consumption through inadvertent actuation of contacts when the calculator-wristwatch is in a timekeeping operating mode. It is noted however that an N-channel transistor 117 is not disposed intermediate the touch sensitive contact 94 and C-MOS inverter 106 since the touch contact 94 is utilized as a change-over switch for changing the wristwatch-calculator from the display of hours, minutes and seconds to the display of the month and date, and therefore must be used during timekeeping operation.

Also, when the wristwatch-calculator is disposed in a calculating mode, the touch sensitive switch inputs are likely to be accidentally energized by water, dust, static electricity and the like, and thereby cause an actuating signal to be continuously applied to the calculator circuitry. In such an event, the set signal output of gate 87j of FIG. 11A is applied to AND gates 82a, 82b, etc., but the reset signal 111 is not applied to the R-S flip-flop circuit of chatter prevention circuit 84. In order to detect this case, the set signal of gate 87j is also applied as set signal 124 of the R-S flip-flop circuit of alarm circuit 93 and the reset signal 111 is also applied as a reset signal 125 to alarm circuit 93. When an improper input is applied as described above, output 126 of alarm circuit 93 remains unchanged. The unusual duration of output 126 would be detected and applied to either light or flicker a decimal point in the display or some other visual indication, to provide an alarm indication.

As noted above, in view of the excessive current consumed during the operation of the calculating function, by providing a contact input prevention circuit for preventing unwanted inputs from being applied to the calculator circuitry, and additionally by providing an alarm circuit that prevents against accidental continuous actuation of a touch sensitive contact due to dust, water and the like, the current consumption of the calculator circuitry can be sharply reduced.

Accordingly, the instant invention is particularly characterized by the use of a touch sensitive input for an electronic utilization device such as an electronic wristwatch, electronic calculator or a combination thereof. Specifically, the touch sensitive devices are comprised of a touch sensitive contact and a detector circuit formed of N-channel field effect transistors, P-channel field effect transistors or complementary coupled P-channel and N-channel transistors.

It will thus be seen that the objects set forth above, among those made apparent from the preceding description, are efficiently attained and, since certain changes may be made in the above construction without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. A touch sensitive input for an electronic utilization device comprising a voltage source referenced to a first potential, touch sensitive contact means, said touch sensitive contact means including a conductive resistive contact member for connection to ground through the skin resistance of a user upon engagement thereof by the user; and detector circuit means including a C-MOS inverter input stage having an input to which said touch sensitive contact member is connected and an output, a resistor coupled intermediate said voltage source and said C-MOS inverter stage input, said resistor being selected to have a value substantially greater than the value of the average skin resistance of a likely user so that the input of said inverter stage of said detector circuit means is normally referenced to said first potential for producing a detector circuit output signal representative of said first potential, said touch sensitive contact means selectively referencing said detector circuit means input to a second potential in response to engagement of said touch sensitive contact member to ground through the skin resistance of a user, said detector circuit means producing at its output a detector circuit output signal representative of the second potential in response to application of said second potential to the input thereof.

2. A touch sensitive input as recited in claim 1, including an odd number of said C-MOS inverter stages connected in series.

3. A touch sensitive input as claimed in claim 2, including chatter elimination circuit means coupled to the output of the last of said inverter stages for removing the effect of chatter from the output signal produced by the last of said inverter stages.

4. A touch sensitive input as recited in claim 1, wherein said C-MOS inverter stage includes a source-drain path and a voltage source, and further including gate means intermediate said source-drain path and said voltage source for periodically connecting said source-drain path to said source for limiting the period of the detector circuit output signal representative of said second potential.

5. A touch sensitive input for an electronic utilization device comprising at least two touch sensitive contact means; and detector circuit means associated with each touch sensitive contact means having an input to which said touch sensitive contact means is connected and an output, each said detector circuit means including means normally referencing the input thereof to a first potential for producing a detector circuit output signal representative of said first potential, each of said touch sensitive contact means selectively referencing said detector circuit means input to a second potential in response to engagement of said touch sensitive contact means, said detector circuit means producing at its output a detector circuit output signal representative of the second potential in response to application of said potential to the input thereof, and multiple input prevention circuit means for receiving the outputs of said detector circuit means for selectively transmitting only the first of overlapping output signals of said detector circuit means representative of said second potential.

6. A touch sensitive input for an electronic utilization device comprising touch sensitive contact means; and detector circuit means having an input to which said touch sensitive contact means is connected and an output, said detector circuit means including means normally referencing the input thereof to a first potential for producing a detector circuit output signal representative of said first potential, said touch sensitive contact means selectively referencing said detector circuit means to a second potential in response to engagement of said touch sensitive contact means, said detector circuit means producing at its output a detector circuit output signal representative of the second potential in response to application of said second potential to the input thereof, abnormal actuation detection circuit means coupled to the output of said detector circuit means for detecting the continuance of said output signal representative of said second potential beyond a predetermined duration, and alarm means providing a visual indication of the detection of such abnormal actuation of said touch sensitive contact means.

7. A touch sensitive input as recited in claim 1, wherein said electronic utilization device is an electronic calculator.

8. A touch sensitive input as recited in claim 1, wherein said electronic utilization device is an electronic timepiece incorporating an electronic calculator.

9. A touch sensitive input as claimed in claim 5, and including input control means coupled to said multiple input prevention means for applying multiple input prevention signals thereto and encoder means disposed intermediate each of said detector circuit means and said multiple input prevention means for encoding each output signal produced by each said touch sensitive contact means and in response thereto applying at least a leading edge of the first output signal when more than one output signal is coincidentally produced by the respective conductive resistive contact members to the input control means and to said multiple input prevention means.

10. A touch sensitive input as claimed in claim 9, wherein said input control means includes first and second set-reset flip-flop circuit means, said flip-flop circuit means receiving the leading edge of said first output signal produced by said encoder means and in response thereto apply a set signal to said multiple input prevention means, said second set-reset circuit means receiving said leading edge of said first output signal produced by said encoding means and in response thereto apply a reset signal to said multiple input prevention means, said multiple input prevention means in response to said set signal and reset signal applied thereto producing an information signal having a duration equal to the interval between the application of said set signal and said reset signal and representative of the conductive resistive contact member engaged by a user that produced the output signal having the first leading edge.

11. A touch sensitive input as claimed in claim 10, and including abnormal actuation detection circuit means coupled to said input control means for receiving said set signal and reset signal produced thereby and alarm means for being actuated when the duration between said set signal and reset signal is greater than a predetermined duration representative of normal operation.

* * * * *